United States Patent
Schieke et al.

(10) Patent No.: US 8,988,134 B2
(45) Date of Patent: Mar. 24, 2015

(54) SYSTEM AND METHOD FOR OPERATING LOW POWER CIRCUITS AT HIGH TEMPERATURES

(71) Applicant: Microchip Technology Incorporated, Chandler, AZ (US)

(72) Inventors: Pieter Schieke, Phoenix, AZ (US); Rodney Drake, Queen Creek, AZ (US); Clark Rogers, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/784,655

(22) Filed: Mar. 4, 2013

(65) Prior Publication Data

US 2014/0247086 A1    Sep. 4, 2014

(51) Int. Cl.
H01L 35/00     (2006.01)
G05F 3/02      (2006.01)

(52) U.S. Cl.
CPC .................................... *G05F 3/02* (2013.01)
USPC ........................................... 327/513; 331/16

(58) Field of Classification Search
CPC ............ G05F 3/30; H03F 1/302; G01K 7/01; H01L 23/34; H03K 2017/0806
USPC ............. 327/513, 107; 331/16, 34, 1 A, 167, 331/177 V, 117 R, 177 FE; 365/230.01, 365/230.06, 230.08, 238.5, 233.5, 235, 365/189.05, 236
See application file for complete search history.

(56) References Cited

U.S. PATENT DOCUMENTS

| | | | |
|---|---|---|---|
| 3,440,521 A | 4/1969 | Kessler | 323/275 |
| 5,526,320 A * | 6/1996 | Zagar et al. | 365/233.5 |
| 7,768,342 B1 | 8/2010 | Mcmahill | 327/538 |
| 2004/0108907 A1 | 6/2004 | Lim et al. | 331/66 |
| 2005/0134393 A1 | 6/2005 | Kim et al. | 331/36 C |
| 2011/0095791 A1* | 4/2011 | Filipovic et al. | 327/107 |
| 2013/0015895 A1 | 1/2013 | Nguyen | 327/156 |

FOREIGN PATENT DOCUMENTS

JP     55118207 A     9/1980     ............... H03B 5/04

OTHER PUBLICATIONS

International Search Report and Written Opinion, Application No. PCT/US2014/018297, 13 pages, May 26, 2014.

* cited by examiner

*Primary Examiner* — Diana J Cheng
(74) *Attorney, Agent, or Firm* — King & Spalding L.L.P.

(57) ABSTRACT

A system includes first circuitry including first elements for operating in a low power mode; second circuitry including second elements for operating in a high-temperature mode; and one or more switching elements for selecting between the low power mode and the high temperature mode.

20 Claims, 2 Drawing Sheets

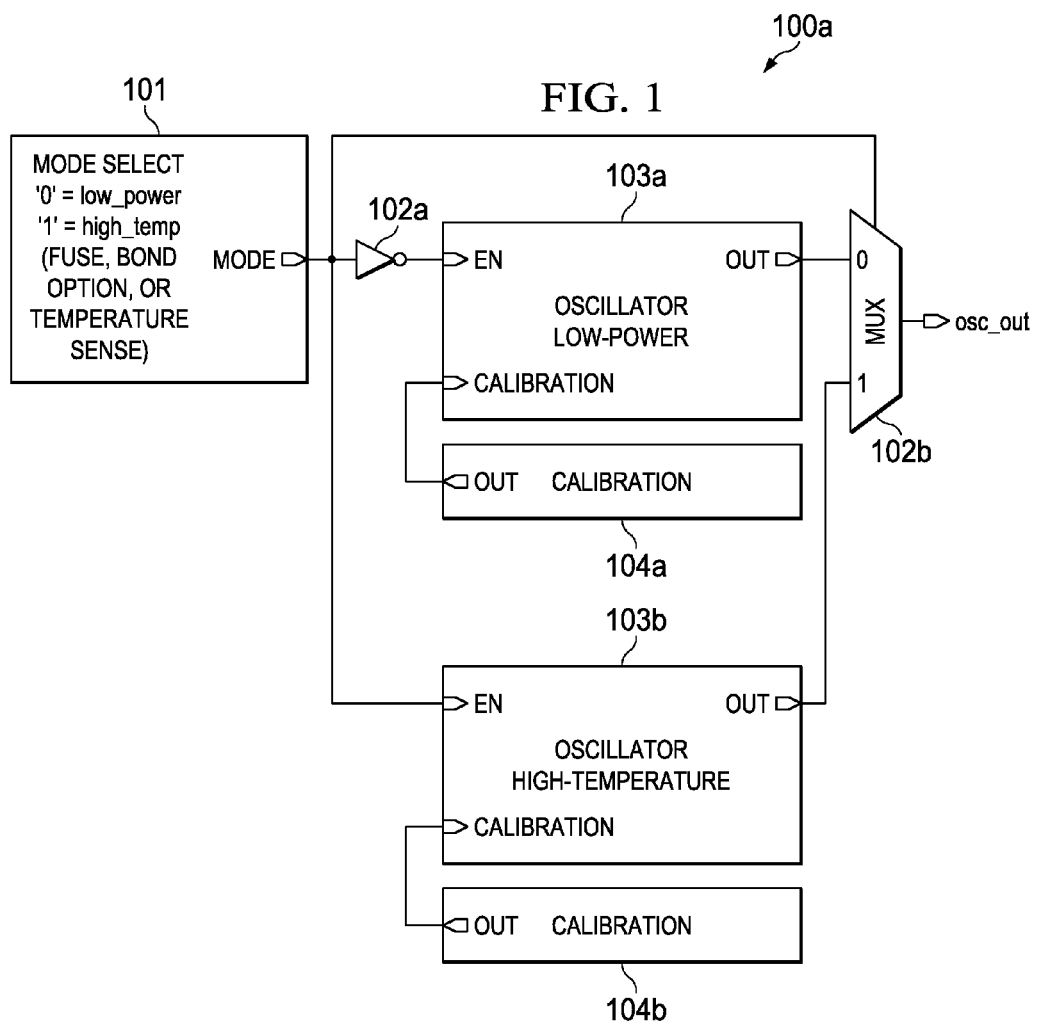

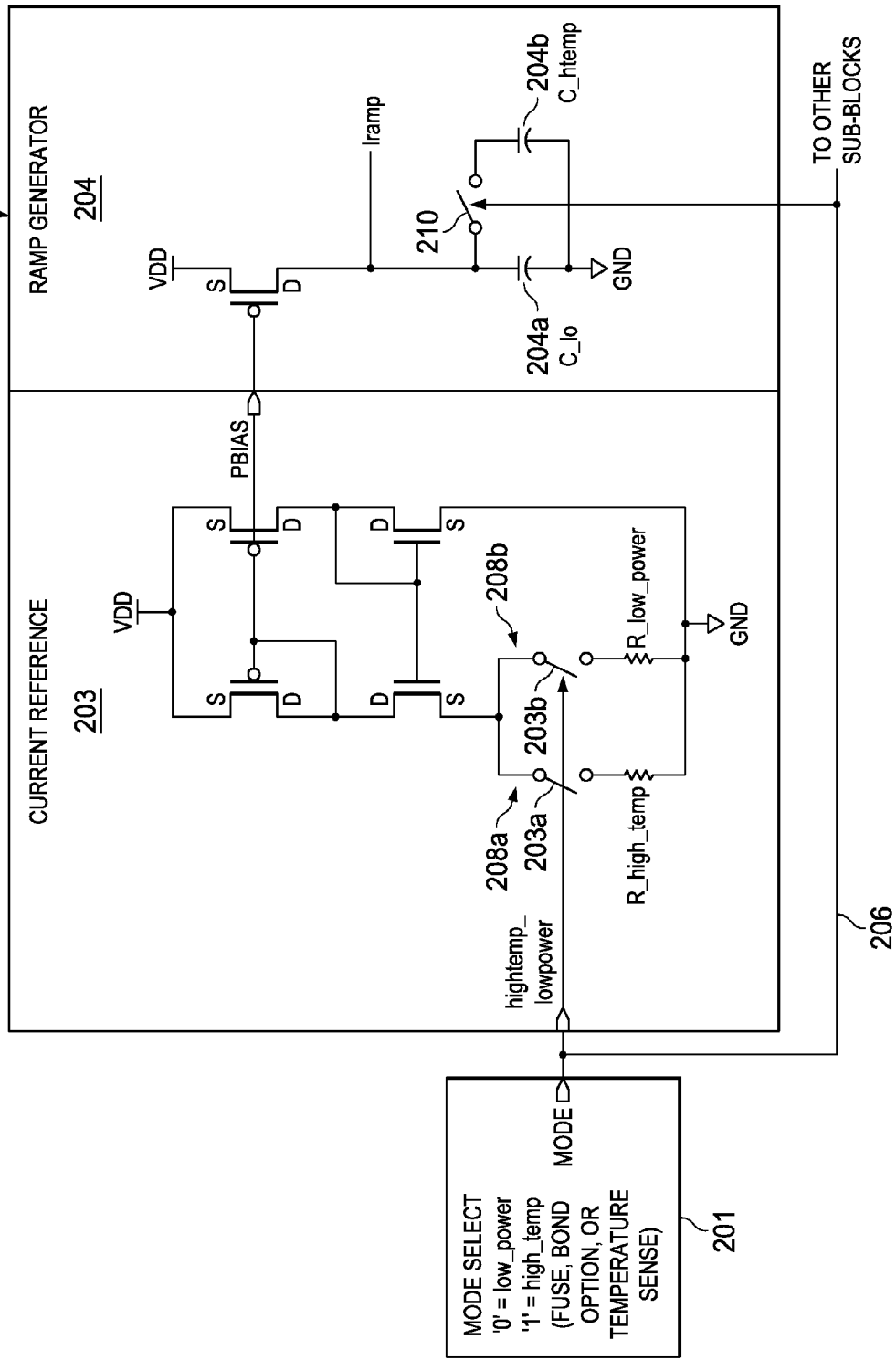

SYSTEM AND METHOD FOR OPERATING LOW POWER CIRCUITS AT HIGH TEMPERATURES

BACKGROUND OF THE INVENTION

1. Field of the Invention

This invention relates generally to low-power circuits and, particularly, to low-power circuits capable of operating at relatively high temperatures.

2. Description of the Related Art

Electronic devices are increasingly designed to have low power or battery power functionality. As a consequence, energy conservation is an important requirement for microcontrollers and other circuits that implement the device features.

Many devices operate in "sleep" or "standby" modes with circuits configured to function with low standby currents, e.g., standby current as low as 9 nA. In some implementations, such circuits are specified to function from −40 C to 85 C. However, some applications, referred to as "extended temperature" applications, require functionality at temperatures up to 150 C. Unfortunately, however, in circuits that burn very low currents, as temperature of operation increases, leakage current increases exponentially. This results in circuit failure because all or most of the bias current flowing in the circuit can leak to ground and/or to the power supply rail.

Thus, historically, there has been a trade off between low current and high temperature operation.

SUMMARY OF THE INVENTION

These and other drawbacks in the prior art are overcome in large part by a system and method according to embodiments of the present invention.

More particularly, in accordance with embodiments, circuitry is provided in which the amount of current used is adjusted responsive to temperature. In some embodiments, the circuitry is operable in two modes: low-power and high-temperature.

A system for use in an integrated circuit includes first circuitry including first elements for operating in a low power mode; second circuitry including second elements for operating in a high-temperature mode; and one or more switching elements for selecting between the low power mode and the high temperature mode.

A method for ensuring temperature-related circuit operation includes providing a temperature-based control signal; and switching circuit operation between first and second circuitry responsive to the temperature-based control signal, wherein the first circuitry includes first elements for operating in a low power mode and the second circuitry includes second elements for operating in a high-temperature mode. In the case where a control circuit measures the temperature and then automatically selects low-power or high-temperature mode, hysteresis could be added to avoid quickly toggling between the two modes as the sensed temperature crosses the trip point.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

FIG. 1 is a block diagram illustrating an exemplary circuit in accordance with embodiments.

FIG. 2 is a diagram of another circuit in accordance with embodiments.

DETAILED DESCRIPTION OF EMBODIMENTS OF THE INVENTION

As will be discussed in greater detail below, circuitry is provided implementing low current standby operation. The circuitry is operable in a first, low-power mode in a standard temperature range and at least one second mode operable at temperatures that exceed the standard temperature range. An exemplary standard temperature range is −40 to 85 C. An exemplary extended temperature range is up to approximately 150 C.

Turning now to the drawings and, with particular attention to FIG. 1, a diagram of an exemplary circuit 100 for low-power and high-temperature modes in accordance with embodiments is shown.

The circuit 100 includes a circuit 103a configured for low-power operation and a circuit 103b configured for high-temperature operation. In the embodiment illustrated, the circuits 103a, 103b are oscillator circuits, although the circuits 103a, 103b can represent any circuit function that is sensitive to degradation at high temperature and where power consumption is a concern. Further, it is noted that, while only two discrete operating modes are discussed herein, other embodiments may include circuits functioning at a continuum of operating power levels as a function of temperature.

A mode selection module 101 is provided to deliver a mode select signal or control to the circuit. The mode select module 101 may be implemented as any suitable circuit or control for selecting modes. For example, the mode select module may be implemented as an on-chip fuse that is programmed to pre-select whether the part's operation will be optimized for low-power or high-temperature; a bond-wire that is placed during assembly; the output of a circuit that measures temperature and selects the mode of operation; or a mode register (that is controlled by the user's software). Thus, the mode select module 101 may be implemented as a manual control or as an automatic control, for example responsive to a temperature sensing function.

In the example illustrated, the mode select input is provided to an inverter 102a, a multiplexer 102b's control input, and to the high-temperature circuit 103b. Thus, the low-power mode is selected if the mode select input is low (0) but the high-temperature mode is selected if the mode select input is high (1). The inverter 102a thus functions to enable the corresponding circuit 103a, 103b, while the multiplexer 102b selects its output.

In some embodiments, additional circuits 104a, 104b, functioning as calibration units may be provided. The calibration units 104a, 104b may serve to "trim" the functions of the corresponding circuits 103, 103b respectively, that serve to optimize performance for the respective temperature range of operation FIG. 2 illustrates another embodiment. More particularly, in FIG. 2, a single circuit 202 is provided which includes circuit elements that are sensitive to high temperatures.

The mode select unit 201 is generally similar to the mode select unit 101 of FIG. 1. In this embodiment, however, the mode select signal may be an analog signal representing temperature.

Circuit 202 is a function that is sensitive to disruption or degradation in operation due to leakage current present at high temperatures. In the example illustrated, a ramp generator 204 generates a ramp by creating a reference current 203 that is used to charge a capacitor 204a. In the low power mode, resistor 203b couples to the circuit via switch 208b.

For low power operation, currents used in 203 are minimized. However, at high temperatures, unwanted leakage currents are present in addition to the desired currents. These leakage currents can occur from several sources. For example, all MOS source and drain implants contain parasitic diodes to the wells and substrates present in CMOS circuits. These diodes are reverse biased but conduct leakage currents that increase exponentially with rise in temperatures.

To maintain performance at high temperatures, desired currents can be used in 203 as generated by enabling a different resistor 203b (via switch 208a), rather than resistor 203a for the low current mode. Thus, desired currents can be generated that are larger than the leakage currents, although at the expense of higher power consumption. In addition, to keep the same ramp rate with the new current setting, the charging capacitance value may likewise need to change. Thus, a second charging capacitor 204b may be provided for the high temperature, higher current mode, switchable using switch 210.

In some embodiments, then, the mode select signal 206 controls operation of switches 208a, 208b and 210 for changing the resistances and capacitances and thus the current usage, depending on temperature.

While specific implementations and hardware/software configurations for the mobile computing device have been illustrated, it should be noted that other implementations and hardware configurations are possible and that no specific implementation or hardware/software configuration is needed. Thus, not all of the components illustrated may be needed for the mobile computing device implementing the methods disclosed herein.

As used herein, whether in the above description or the following claims, the terms "comprising," "including," "carrying," "having," "containing," "involving," and the like are to be understood to be open-ended, that is, to mean including but not limited to. Only the transitional phrases "consisting of" and "consisting essentially of," respectively, shall be considered exclusionary transitional phrases, as set forth, with respect to claims, in the United States Patent Office Manual of Patent Examining Procedures.

Any use of ordinal terms such as "first," "second," "third," etc., in the claims to modify a claim element does not by itself connote any priority, precedence, or order of one claim element over another, or the temporal order in which acts of a method are performed. Rather, unless specifically stated otherwise, such ordinal terms are used merely as labels to distinguish one claim element having a certain name from another element having a same name (but for use of the ordinal term).

The above described embodiments are intended to illustrate the principles of the invention, but not to limit the scope of the invention. Various other embodiments and modifications to these preferred embodiments may be made by those skilled in the art without departing from the scope of the present invention.

What is claimed is:

1. A system for ensuring operation of low power circuits at high temperature, comprising:
   circuit elements that are sensitive to high temperatures, further comprising an oscillator comprising a current reference and a ramp generator that can be controlled to operate in a first mode and in a second mode to generate said output signal, wherein the first mode is a low power mode and the second mode is a high temperature mode, wherein the oscillator comprises a control input receiving a control signal, and wherein depending on the control signal, the current reference and ramp generator operate either in the first or second mode; and
   a selection unit for controlling the functional unit to operate in the low power mode or the high temperature mode.

2. A system in accordance with claim 1, wherein the oscillator comprises first and second resistors and wherein the first and the second resistors are selectable responsive to a temperature change.

3. A system in accordance with claim 1, wherein the selection unit is a temperature selection controller.

4. A system in accordance with claim 1, wherein the selection unit is a bond wire.

5. A system in accordance with claim 1, wherein the selection unit is a mode register control.

6. A system in accordance with claim 1, wherein the selection unit is a fuse.

7. A method for ensuring temperature-related circuit operation, comprising:
   providing a temperature-based control signal;
   providing an oscillator comprising a current reference and a ramp generator for generating an output clock signal wherein the current reference and ramp generator can be controlled to operate in a first or second mode, wherein the first mode is a low power mode and the second mode is a high temperature mode,
   based on the control signal operating the current reference and ramp generator to generate said output signal in the first or the second mode.

8. The method of claim 7, wherein switching between the first and second mode comprises adjusting current flow, voltages, or charge, for circuit operation.

9. An integrated circuit comprising:
   an oscillator generating an output clock signal comprising a current reference and a ramp generator, wherein the current reference and ramp generator can be controlled to operate in a first or second mode, wherein in the first mode is a low power mode and the second mode is a high temperature mode,
   wherein the oscillator comprises a control input receiving a control signal, and wherein depending on the control signal, the current reference and ramp generator operate either in the first or second mode.

10. The integrated circuit according to claim 9, wherein the control signal is provided by a temperature selection controller, a bond wire, a mode control register, or a fuse.

11. The integrated circuit according to claim 9, wherein the current reference is controllable to generate a first current in the first mode and a second current in the second mode wherein the second current compensates for leakage currents in a high temperature range.

12. The integrated circuit according to claim 11, wherein the ramp generator comprises a first charging capacitor which is determining a ramp rate in the first mode and a second charging capacitor which can be switched in parallel to said first charging capacitor to determine a second ramp rate in the second mode.

13. The integrated circuit according to claim 12, wherein the current reference comprises a current mirror.

14. The integrated circuit according to claim 13, wherein the ramp generator is coupled with the current mirror such that a ramp current is defined by the current mirror.

15. The integrated circuit according to claim 11, comprising a switching unit for selecting a first or a second resistor, wherein the first resistor defines the first current and the second resistor defines the second current.

16. The integrated circuit in accordance with claim 15, wherein the first resistor and the second resistor are selectable responsive to a temperature change.

17. The integrated circuit in accordance with claim 15, wherein the control signal is provided by a temperature selection controller.

18. The integrated circuit in accordance with claim 15, wherein the control signal is provided by a bond wire.

19. The integrated circuit in accordance with claim 15, wherein the control signal is provided by a mode register control.

20. The integrated circuit in accordance with claim 15, wherein the control signal is provided by a fuse.

* * * * *